United States Patent [19]

Sone

[11] Patent Number: 4,538,077
[45] Date of Patent: Aug. 27, 1985

[54] CIRCUIT UTILIZING JOSEPHSON EFFECT

[75] Inventor: Junichi Sone, Tokyo, Japan

[73] Assignee: Nippon Electric Co., Ltd., Tokyo, Japan

[21] Appl. No.: 415,877

[22] Filed: Sep. 8, 1982

[30] Foreign Application Priority Data

Sep. 10, 1981 [JP] Japan .................................. 56-142748
Sep. 10, 1981 [JP] Japan .................................. 56-142749
Sep. 14, 1981 [JP] Japan .................................. 56-145313

[51] Int. Cl.$^3$ ........................................ H03K 19/195
[52] U.S. Cl. ................................. 307/476; 307/277; 307/306; 307/462
[58] Field of Search ............... 307/277, 476, 306, 462; 365/162; 357/5

[56] References Cited

U.S. PATENT DOCUMENTS

| | | | |
|---|---|---|---|
| 4,274,015 | 6/1981 | Faris | 307/277 |
| 4,275,314 | 6/1981 | Fulton | 307/277 |
| 4,313,066 | 1/1982 | Gheewala | 307/306 |
| 4,413,196 | 11/1983 | Josephs et al. | 307/306 |

OTHER PUBLICATIONS

T. R. Gheewala, "Josephson-Logic Devices and Circuits" IEEE Trans. on Electron Devices, vol. Ed-27, No. 10, Oct. 1980, pp. 1857-1869.
T. R. Gheewala, "Josephson Logic Circuits Based on Nonlinear Current Injection in Interferometer Devices", Appl. Phys. Lett., vol. 33, No. 8, Oct. 1978, pp. 781-783.
E. P. Harris, "Turn-On Delay of Josephson Interferometer Logic Devices" IEEE Trans. on Magnetics, vol. MAG-15, No. 1, Jan. 1979, pp. 562-565

Primary Examiner—John Zazworsky
Attorney, Agent, or Firm—Sughrue, Mion, Zinn, Macpeak & Seas

[57] ABSTRACT

A circuit utilizing Josephson junctions to perform high speed logic gate switching functions. Three "Y" connected resistors have Josephson junction devices at their non-connected ends. The resistances of the resistors, the critical currents of the Josephson junctions, and the amplitudes of input currents to two of the resistor-Josephson junction connections are selected so that, when the input currents are applied at the same time, the third Josephson junction is switched to the voltage state and both input currents are derived from the third Josephson junction-resistor connection as an input current. In another embodiment, the basic circuit has additional resistor-Josephson junction input arms, producing an M/N logic gate function. In another embodiment, the resistors are "Δ" connected. The resulting logic gates have wide operational margins, high speed switching capabilities and small size.

16 Claims, 8 Drawing Figures

CIRCUIT UTILIZING JOSEPHSON EFFECT

BACKGROUND OF THE INVENTION

The present invention relates to circuits utilizing the Josephson effect and, more particularly, to such a logic gate which has a very short gate delay time and a wide operational margin and which is feasible for a high degree of integration.

Various kinds of logic gates have been proposed using Josephson junctions to take advantage of their low power dissipation and high switching speeds. For example, refer to the paper, "Josephson-Logic Devices and Circuits" by TUSHAR R. GHEEWALA, IEEE TRANSACTIONS ON ELECTRON DEVICES, VOL. ED-27, NO. 10, OCTOBER 1980, PP 1857–1869. The basic construction of the logic gate is of the interference type, consisting of a plurality of Josephson junctions and inductances adapted to electrically connect the Josephson junctions. An input current is directly injected into the logic gate or electromagnetically coupled with a control line of the logic gate, thereby switching the gate to the voltage state. T. R. Gheewala describes in his paper "Josephson logic circuits based on nonlinear current injection in interferometer devices", Applied Physics Letter, Vol. 33, No. 8, pp. 781–783, a Josephson logic gate which is designed for wider margins and higher switching speeds. FIG. 3(a) in page 782 of this paper shows an AND gate equipped with an interferometer gate having two Josephson junctions having critical currents $I_{01}$ and $I_{02}$, respectively, and a series connection of inductances $L_1$ and $L_2$ having inductance values $L_1'$ and $L_2'$. The Josephson junctions are connected in parallel by the series connection of the inductances. One input $I_a$ is coupled to the node between the inductances $L_1$ and $L_2$ and the other $I_b$ to one end of the inductance $L_1$. To optimize the operation (operational margins) of this gate, the inductance values $L_1'$ and $L_2'$ and the critical currents $I_{01}$ and $L_{02}$ are chosen to satisfy equations:

$$L_1'I_{01} = L_2'I_{02} \tag{1}$$

$$I_{02}(L_1' + L_2') = \phi_0 \tag{2}$$

where $\phi_0$ indicates a natural constant called "magnetic flux quantum" and having a value of the order of 2.07 pH.mA. However, the logic gate as described above is disadvantageous in various respects. Although the critical current should be small in order to reduce the power dissipation, the current $I_{02}$ and the inductance values $L_1'$ and $L_2'$ cannot be reduced at the same time as seen from the equation (2) so that a large chip area is required to attain this lower power dissipation. Since the gate includes both inductances and Josephson junction capacitance, a resonance phenomena is caused which should be damped for high speed operations. Furthermore, a gate of this kind tends to trap stray magnetic fields when switching to its superconducting state; the trapped magnetic fields can cause the gate to malfunction. These problems exist not only in the above-described AND gate but in all logic gates of the interference type.

U.S. Pat. No. 4,275,314 discloses an AND gate which attempts to eliminate the above-described drawbacks by not providing with an inductance component. The AND gate, as shown in FIG. 3 of this U.S. Pat. specification, uses the circuit indicated in FIG. 1 (named JAWS) as a one-input OR gate and cascades two such OR gates. When one input is supplied to the first stage JAWS, the bias current fed to the first stage JAWS is coupled to the second stage JAWS as the second bias current. When the other signal arrives at the second stage JAWS, the second bias current is steered to the output side. This type of logic gate, although free from the drawbacks inherent in the AND gate previously described due to the absence of inductance component, nonetheless possesses several disadvantageous characteristics. First, the cascaded JAWS result in a high degree of intricacy in the circuit construction. Second, the input sensitivity, i.e., the ratio of the input current to the minimum amount of current necessary to switch the device, is as small as 1, which makes the overdrive capability relatively small. This reduction in overdrive capability reduces the ability of the gate to speed up the switching action (i.e. shorten the turn-on delay time of the gate). In more detail, an output of a gate using Josephson junctions generally appears (with a time constant of a load resistance $R_L$ and a Josephson junction capacitance C) upon the lapse of a turn-on delay time after an input current has exceeded a threshold for the circuit operation. The turn-on delay time decreases inversely with respect to the overdrive capability defined by $(I_0 - I_{th})/I_0$ where $I_0$ is the input current and $I_{th}$ the threshold current for a predetermined gate current, as described in TURN-ON DELAY OF JOSEPHSON INTERFEROMETER LOGIC DEVICES, IEEE TRANSACTIONS ON MAGNETICS, VOL. MAG-15, NO. 1, JANUARY 1979, pp. 562–565. Obviously, the overdrive capability increases with the input sensitivity which is defined by an inclination of a control characteristic line of the gate while the turn on delay time decreases as the input sensitivity becomes higher. Thus, it is desirable to make the input sensitivity as high as possible in order to speed up the switching actions of the gate by shortening the turn-on delay time. As previously mentioned, the input sensitivity of the above-mentioned gate is 1 which is relatively low sensitivity to promote high speed switching.

Using the interferometer gate already discussed, a logic gate can be constructed having two or more input lines, and producing an output when input currents flow through a predetermined number or more of the input lines, (e.g., a ⅔ logic gate can be produced in which an output appears when input currents flow through two or more of three input lines). In the ⅔ logic gate, for instance, a gate current is constantly fed to the Josephson junctions $J_1$ and $J_2$ through the inductances $L_1$ and $L_2$ of the interferometer gate, respectively, and the critical currents are selected such that the gate switches in response to the flow of input currents through two or more of the three input lines.

With this construction, however, not only do the previously described problems remain unsolved, but the input current margins are narrow and it is difficult to realize a highly integrated circuit. More specifically, supposing that the minimum input current necessary for switching a gate under the supply of a gate current is $I_t$, the range (margins) of the input current $I_{in}$ required for operation of the ⅔ logic gate is quite narrow (e.g., between $I_t/2$ and $I_t$). With respect to actual production, however, the input current margins will be still narrower in view of the lack of uniformity of critical current and inductance among integrated circuits. Moreover, the need for three input lines for magnetic coupling in the gate cannot be met without rendering the device design quite difficult since it is hard to equalize the degrees of magnetic coupling between the input lines and the inductances. These problems also exist in multi-input AND gates.

SUMMARY OF THE INVENTION

It is an object of the present invention to provide a circuit utilizing the Josephson effect which is feasible for high integration and free from resonance due to the capacitance of Josephson junctions.

It is another object of the present invention to provide a circuit utilizing the Josephson effect which is provided with wide operational margins and capable of high speed switching.

It is a further object of the present invention to provide a two-input AND gate utilizing the Josephson effect which has the advantages mentioned above.

It is yet another object of the present invention to provide a multi-input logic gate utilizing the Josephson effect which has the various advantages mentioned above and produces an output when inputs come in through a predetermined number or more of multiple inputs.

It is a still further object of the present invention to provide an amplifier utilizing the Josephson effect which features all the advantages described above.

In accordance with one embodiment of the present invention, there is provided a circuit comprising a first resistor, a second resistor and a third resistor having predetermined resistances $R_1$, $R_2$ and $R_3$, respectively, and connected together at one end thereof, a first Josephson junction and a second Josephson junction having predetermined critical currents $I_{01}$ and $I_{02}$, respectively, and connected in parallel with the other end of the first and second resistors, respectively, and a specific Josephson junction having a predetermined critical current $I_0$ and connected in series with the other end of the third resistor; and circuits utilizing the Josephson effect having the AND function whereby an output current may be derived from the node between the third resistor and the specific Josephson junction when the first and second input currents are supplied at the same time, and having an amplifying function whereby a predetermined gate current is constantly supplied from the other end of the second resistor and an output, which is an amplified version of an input current from the other end of the first resistor, appears at the node between the third resistor and the specific Josephson junction.

In accordance with another embodiment of the present invention, there is provided a circuit utilizing the Josephson effect and having the multi-input AND function in which a plurality of resistors are additionally connected at one end thereof to the node among the first, second and third resistors of above-mentioned circuits, each of said plurality of resistors having a Josephson junction with a predetermined critical current connected in parallel at the other end thereof. Properly selecting the resistances, critical currents and input currents will provide a circuit having an M/N logic gate ($M \leq N$) function.

In accordance with yet another embodiment of the present invention, there are provided circuits comprising a first resistor and a second resistor connected together at one end thereof and provided with predetermined resistances, respectively, a first Josephson junction and a second Josephson junction connected in parallel with the other end of the first and second resistors, respectively, and having predetermined critical currents, a specific Josephson junction having a predetermined critical current and connected in series with the node between the first and second resistors, and a first specific resistor connected between the other end of the first and second resistors and having a predetermined resistance; and circuits utilizing the Josephson effect having an AND function whereby an output appears at the node between the specific Josephson junction and the first and second resistors when input currents are supplied to the other end of the first and second resistors at the same time, and having an amplifying function whereby a predetermined gate current is caused to constantly flow from the other end of the second resistor and an output, which is an amplified version of an input current from the other end of the first resistor, appears at the node between the specific Josephson junction and the first and second resistor.

Other objects and features of the present invention will become apparent from the following description when read with reference to the accompanying drawings.

DETAILED DESCRIPTION OF THE PREFERRED EMBODIMENTS

Figure 1A:
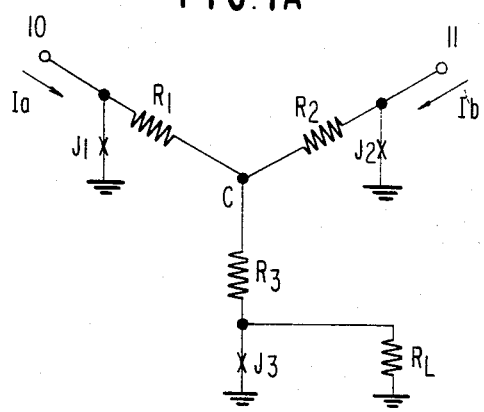
FIGS. 1A and 1B are diagrams of a circuit with a two-input AND function embodying the present invention and a graph showing its control characteristics, respectively.

Referring to FIG. 1A of the drawings, an example of two-input AND gate according to the present invention is illustrated. The AND gate shown includes three resistors $R_1$, $R_2$, and $R_3$ which are connected in Y configuration about a node C. Josephson junctions $J_1$ and $J_2$ are connected in parallel with the resistors $R_1$ and $R_2$, respectively. A Josephson junction $J_3$ is connected in series with the resistor $R_3$, and a load resistor $R_L$ is connected through an output line in parallel with the Josephson junction $J_3$. Critical currents $I_{01}$, $I_{02}$ and $I_{03}$ of the Josephson junctions $J_1$, $J_2$ and $J_3$ and resistances $r_1$, $r_2$ and $r_3$ of the resistors $R_1$, $R_2$ and $R_3$ are individually selected to satisfy the relationship:

$$I_{01} = I_{02} = I_{03}/2 \neq I_0 \tag{3}$$

$$r_1 = r_2 = 2r_3 \tag{4}$$

Suppose that one of input currents $I_a$ and $I_b$ is injected into the AND gate through one of input terminals 10 and 11 (for example the input current $I_a$ through the input terminal 10). Where the input current $I_a$ is preselected to be larger than $I_0$ as defined by the equation (3), the Josephson junction $J_1$ is switched to the voltage state. Two thirds of the input current flowing through the resistor $R_1$ is injected into the Josephson junction $J_3$ through the resistor $R_3$ and one third of the current $I_a$ is injected into the Josephson junction $J_2$ through the resistor $R_2$, as defined by the equation (4). Here, the Josephson junctions $J_2$ and $J_3$ will remain in the zero voltage state to deliver no output current to the resistor $R_L$ if the following relationships are satisfied:

$$I_a/3 \leq I_0 \quad (5)$$

$$I_a > I_0 \quad (6)$$

The input current Ib from input terminal 11 is injected into the AND gate after the input current $I_a$, and satisfies the relationships:

$$I_a/3 + I_b > I_0 \quad (7)$$

$$I_a + I_b > 2I_0 \quad (8)$$

Then, the condition (7) brings the Josephson junction $J_2$ into the voltage state to allow the input currents $I_a$ and $I_b$ to be steered into the Josephson junction $J_3$. The condition (8) then brings the Josephson junction $J_3$ into the voltage state so that the input currents $I_a$ and $I_b$ are passed through the output line to the load resistor $R_L$. Where the supply of the input current $I_b$ occurs before that of the input current $I_a$, the above description will also apply if $I_a$ and $I_b$ are exchanged in the foregoing equations.

Figure 1B:
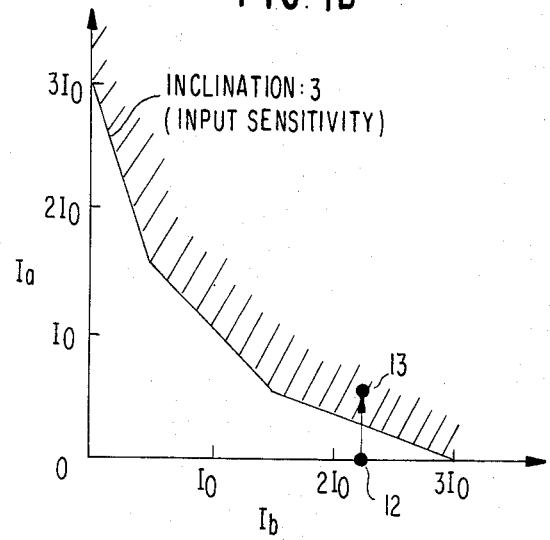

FIG. 1B is a graph showing control characteristics of the logic gate provided by the relationships (5), (6), (7) and (8) and their versions with $I_a$ and $I_b$ interchanged. The hatched area of the graph indicates the voltage state. It will be seen from the graph that when only one of the input currents $I_a$ and $I_b$ is supplied, the logic gate is not switched to the voltage state if the input current is smaller than $3I_0$; when both the input currents $I_a$ and $I_b$ are supplied and have the same magnitude, the logic gate is switched to the voltage state if $I_a = I_b > I_0$. Generally, operational margins of a logic gate for the AND function increase as the input current $I_a(=I_b)$ necessary for the transition of the logic gate to the voltage state under the supply of both the currents $I_a$ and $I_b$ grows smaller than the input current $I_a$ or $I_b$ necessary for transition under $I_a$ or $I_b$ only.

Thus, the logic gate of this embodiment has wide operational margins and, as will be seen from FIG. 1B, its input sensitivity is as high as 3, which promotes high speed switching. Furthermore, in the logic gate according to this embodiment, there is no limitation as indicated by the equation (2), but the Josephson critical currents and resistances need only to satisfy the relationships (3) and (4). The logic gate on the substrate, therefore, can be designed to be very small (that is, the size of the gate is only limited by the ability of the lithography technique). The absence of inductances eliminates the resonance due to the Josephson junction capacitance, and the gate thus requires no additional provision against resonance in the circuit design. Since the logic gate is not of the superconducting loop type, it would not be affected in operation even when trapping stray magnetic fields in the ground plane.

The current injection type logic gate of this embodiment is also usable as a current amplifier due to its high gain characteristic. An amplifier application will now be described with reference to FIG. 2.

Figure 2:
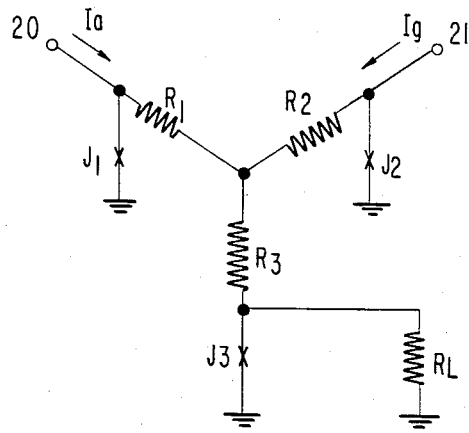
FIG. 2 is a diagram of a circuit using the arrangement shown in FIG. 1A and furnished with the amplifying function.

Referring to FIG. 2, a predetermined current $I_g$ is constantly caused to flow from an input terminal 21. Considering the margins, the current $I_g$ is preset to be 75% of $3I_0$. The operation point, therefore, may be the one indicated by 12 in the control characteristic shown in FIG. 1B (where $I_g = I_b$). In this situation, the minimum input current $I_a$ required for the transition of the logic gate to the voltage state is $0.25 I_0$. Neglecting leak currents of the Josephson junctions under the voltage state, the logic gate will provide an output current expressed as $3I_0 \times 0.75 + 0.25I_0$ which in turn provides a current gain of 10. In practice, the input current $I_a$ will be set at a larger value than $0.25I_0$ in consideration of the margins and, accordingly, the operation point of the gate circuit under the voltage state will correspond to reference numeral 13 shown in FIG. 1B.

Another embodiment of the logic gate of the present invention will be described hereunder which is constructed to produce an output when input currents are supplied through a predetermined number or more of a plurality (three or more) of input lines.

Figure 3A:
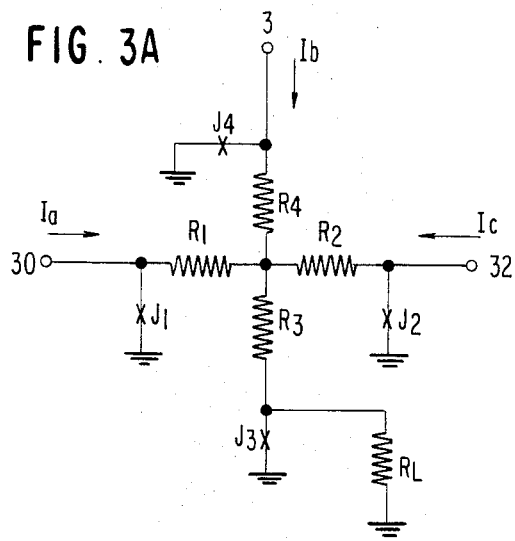
FIGS. 3A and 3B are diagrams of a circuit with a ⅔ logic gate function according to another embodiment of the present invention and a graph showing its control characteristics, respectively.

Referring to FIG. 3A, there is shown a ⅔ logic gate which has input terminals 30, 31 and 32 and produces an output at the load resistor $R_L$ when input currents are supplied to two or more of the three input terminals. Basically, the logic gate shown in FIG. 3A is constructed by connecting one end of a resistor $R_4$ to the node C of the AND gate indicated in FIG. 1A and connecting a Josephson junction $J_4$ in parallel with the other end of the resistor $R_4$. It will be seen that a logic gate with four or more inputs can be designed as desired, employing the same concept.

The logic gate shown in FIG. 3A will operate as follows. For simplicity of description, the Josephson circuits $J_1$, $J_2$, $J_3$ and $J_4$ are assumed to have equal critical current $I_1$ and the resistors $R_1$, $R_2$, $R_3$ and $R_4$ are assumed to be of equal resistance.

Suppose that input currents $I_a$, $I_b$ and $I_c$ are sequentially supplied to the respective input terminals 30, 31 and 32 in the order named. The input current $I_a$ having a value larger than the Josephson critical current $I_1$ switches the Josephson junction $J_1$ to the voltage state and is thereby trisected into the Josephson junctions $J_2$, $J_3$ and $J_4$. In order that the logic gate may not be switched under the above condition, $I_a$ and $I_1$ are chosen to have relationship:

$$I_a/3 < I_1 \quad (9)$$

$$I_a > I_1 \quad (10)$$

Thereafter, the input terminal 31 is supplied with the input current $I_b$ which meets a condition:

$$I_a/3 + I_b > I_1 \quad (11)$$

Then, the Josephson junction $J_4$ is switched to the voltage state so that the input currents $I_a$ and $I_b$ are individually bisected and steered into the Josephson junctions $J_2$ and $J_3$. At this instant, the Josephson junctions $J_2$ and $J_3$ become switched to the voltage state if the following relationship is maintained:

$$I_a + I_b > 2I_1 \quad (12)$$

This allows the composite input current $I_a + I_b$ to flow out into the output line which terminates at the load resistor $R_L$. Though the other input current $I_c$ may thereafter be injected through the input terminal 32, it is simply steered into the output line through the resistors $R_2$ and $R_3$ because all of the Josephson junctions $J_1$, $J_2$, $J_3$ and $J_4$ have been switched to the voltage state. As a result, the input current $I_a+I_b+I_c$ is coupled to the load resistor $R_L$ through an output line. The same operation procedure, except for the interchange of $I_a$ and $I_b$, will occur when $I_b$ is injected into the logic gate before $I_a$.

Figure 3B:
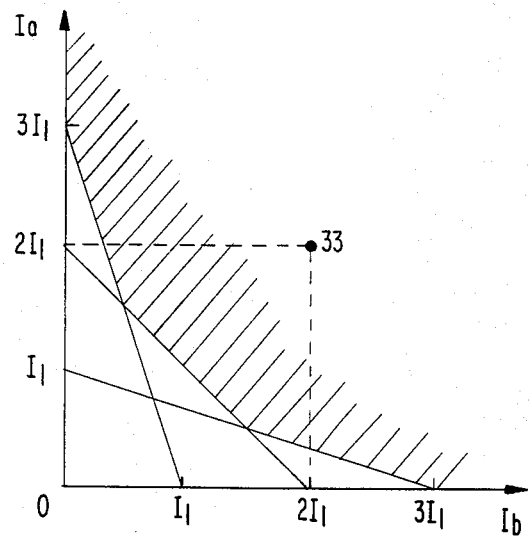

The resulting control characteristics of the logic gate shown in FIG. 3A are graphically represented in FIG. 3B. The hatched area of the graph indicates the voltage state of the logic gate. While the input currents $I_a$ and $I_b$ have been assumed to be coupled to the logic circuit before the input current $I_c$, it will be understood that the control characteristics shown in FIG. 3 also apply to a case wherein the currents $I_a$ and $I_c$ are supplied before the current $I_b$ or to a case wherein the currents $I_b$ and $I_c$ are supplied before the current $I_a$, except for the substitution of $I_a$ and $I_b$ by $I_a$ and $I_c$ or by $I_b$ and $I_c$, respectively. These substitutions hold because the logic gate shown in FIG. 3A is symmetric with respect to the input currents $I_a$, $I_b$ and $I_c$. Indicated by the numeral 33 in FIG. 3B is the operation point of the logic gate provided by the supply of input currents $I_a$ and $I_b$ whose magnitude is $2I_1$.

It will be seen that the logic gate shown in FIG. 3A is properly operable as long as the magnitude $I_0$ of the input currents $I_a$, $I_b$ and $I_c$ satisfies the relationship:

$$I_1 < I_0 \leq 3I_1 \tag{13}$$

The margins of the input current are as wide as $2I_1 \pm 50\%$. Incidentally, the margins of the input current of the prior art ⅔ logic gate which relies on an interferometer are not more than $0.75I_t \pm 33.3\%$. Moreover, as shown in FIG. 3A, the logic gate is fully symmetrical in structure with respect to the input currents $I_a$, $I_b$ and $I_c$, and requires no attention to the uniformity of the magnetic coupling between input currents and inductances, so that the complex device design is avoided. Apart from these outstanding advantages, the absence of inductances as described in relation with FIG. 1A permits the logic gate of FIG. 3A to be made small, highly integrated and freed from an implementation against resonance.

It will be apparent in the circuitry of FIG. 3A that various values can be employed for the input currents, critical currents of the Josephson junctions, and resistances of the resistors. It will also be apparent that a multi-input AND gate can be constructed by selecting each input current and critical current such that when each input current is coupled to the corresponding input terminal, the associated Josephson junction becomes switched to the voltage state, and the Josephson junction $J_3$ is switched to the voltage state by the sum of all the input currents.

Figure 4A:
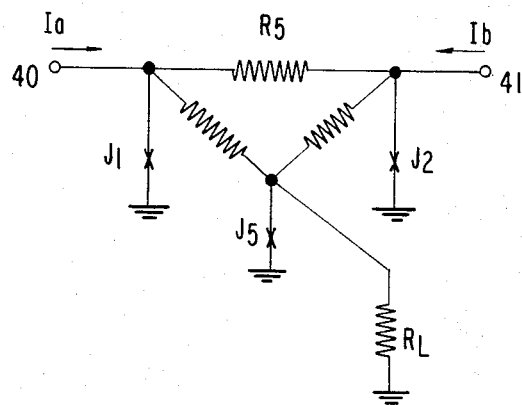
FIGS. 4A and 4B are diagrams of a circuit with a two-input AND function according to still another embodiment of the present invention and a graph showing its control characteristics, respectively.

Referring to FIG. 4A, a farther embodiment of the present invention is shown which is an AND gate having two input terminals. The AND gate in FIG. 4A is essentially similar to the AND gate in FIG. 1A except that the resistor $R_3$ is omitted and replaced by a resistor $R_5$ which is connected between two input terminals. As shown, the AND gate comprises Josephson juntions $J_1$, $J_2$ and $J_5$ having critical currents $I_{01}$, $I_{02}$ and $I_{05}$, resistors $R_1$, $R_2$ and $R_5$ having resistances $r_1$, $r_2$ and $r_5$, a load resistor $R_L$ having a resistance $r_L$, and input terminals 40 and 41 to be supplied with input currents $I_a$ and $I_b$, respectively. In this embodiment, the critical currents $I_{01}$, $I_{02}$ and $I_{05}$ and the resistances $r_1$, $r_2$ and $r_5$ are individually chosen to satisfy relationships:

$$I_{01} = I_{02} = I_{05}/2 \equiv I_0 \tag{14}$$

$$r_1 = r_2 = r_5/2 \tag{15}$$

Suppose that one of input currents $I_a$ and $I_b$ is injected into the AND gate through one of the input terminals 40 and 41, (for example, the input current $I_a$ through the input terminal 40). Where the input current $I_a$ is preselected to be larger than $I_0$ as defined by the equation (14), the Josephson junction $J_1$ becomes switched to the voltage state. Then, two thirds of the input current flowing through the resistor $R_1$ is injected into the Josephson junction $J_5$ and one third is injected into the Josephson junction $J_2$ through the resistor $R_5$, as defined by the equation (15). Here, the Josephson junctions $J_2$ and $J_5$ will remain in the zero voltage state to deliver no output current to the load resistor $R_L$ if the following relationships hold:

$$I_a/3 \leq I_0 \tag{16}$$

$$I_a > I_0 \tag{17}$$

Injected into the AND gate after the input current $I_a$ is the input current $I_b$ through the input terminal 41 which is supposed to meet the relationships:

$$I_a/3 + I_b > I_0 \tag{18}$$

$$I_a + I_b > 2I_0 \tag{19}$$

Then, the condition (18) brings the Josephson junction $J_2$ into the voltage state to allow the input currents $I_a$ and $I_b$ to be injected into the Josephson junction $J_5$. The condition (19) then brings the Josephson junction $J_5$ into the voltage state so that the input currents $I_a$ and $I_b$ are steered through an output line to the load resistor $R_L$. Where the supply of the input current $I_b$ occurs before that of the input current $I_a$, the above description will also apply if $I_a$ and $I_b$ are exchanged in the relationships.

Figure 4B:
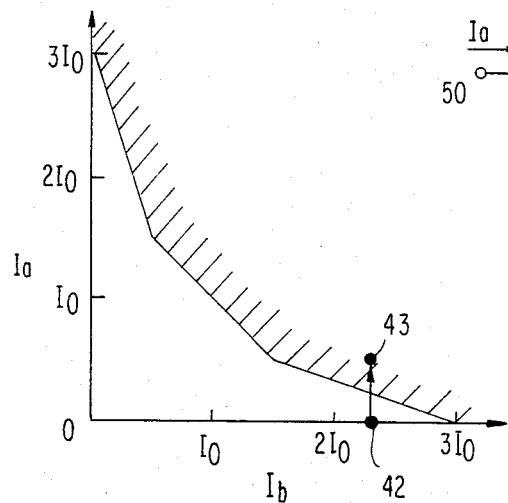

FIG. 4B is a graph similar to FIG. 1B and shows control characteristics of the logic gate provided by the relationships (16) to (19) and their versions with $I_a$ and $I_b$ interchanged. It will be seen from the graph that when only one of the input currents $I_a$ and $I_b$ is supplied, the logic gate is not switched to the voltage state if the input current is smaller than $3I_0$; on the other hand, when both the input currents $I_a$ and $I_b$ are supplied and have the same magnitude, the logic gate is switched to the voltage state if $I_a = I_b > I_0$. Thus, like the AND gate shown in FIG. 1A, the AND gate of FIG. 4A has wide operational margins and is capable of high speed switching. It is apparent that all the advantages discussed in connection with the circuitry of FIG. 1A are applicable to the circuitry of FIG. 4A.

Figure 5:
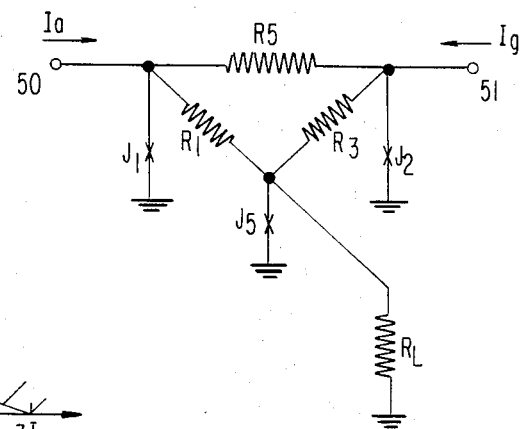
FIG. 5 is a diagram of a circuit having an amplifying function and using the arrangement shown in FIG. 4A.

Thus, the logic gate shown in FIG. 4A is also usable as a current amplifier due to its high gain characteristic. Such an application is illustrated in FIG. 5. As shown, a predetermined current $I_g$ is caused to constantly flow from an input terminal 51. Considering the margins, the current $I_g$ is preset to 75% of $3I_0$. The operation point under this condition may be the one indicated by the numeral 42 in FIG. 4B. In this situation, the minimum input current $I_a$ from an input terminal 50 required for the transition of the logic gate to the voltage state is $0.25I_0$. Neglecting leakage currents of the Josephson junctions under the voltage state, the logic gate will provide an output current expressed as $3I_0 \times 0.75 + 0.25I_0$ which in turn provide a current gain of 10. In practice, the input current $I_a$ will be set at a larger value than $0.25I_0$ in consideration of the margins and, accordingly, the operation point of the gate circuit under the voltage state will be the one corresponding to 43 shown in FIG. 5.

What is claimed is:

1. A circuit utilizing a plurality of Josephson junctions each of which switches from a zero voltage state to a voltage state in response to a current greater than its respective critical current, said circuit comprising:
   a first resistor, a second resistor and a third resistor having predetermined resistances $R_1$, $R_2$, $R_3$, respectively, each of said resistors having first and second ends and all of said resistors being connected together at said second ends thereof, said first ends of said first and second resistors receiving input currents and said first end of said third resistor providing an output current;
   a first Josephson junction and a second Josephson junction having predetermined critical currents $I_{01}$ and $I_{02}$, respectively, and connected between a reference potential and the first end of said first and second resistors, respectively; and
   a specific Josephson junction having a predetermined critical current $I_{03}$ and connected in series with said third resistor.

2. A circuit as claimed in claim 1, further comprising a fourth resistor having a predetermined resistance and connected to said first end of said third resistor in parallel to said specific Josephson junction.

3. A circuit as claimed in claim 1, further comprising a first input terminal connected to said first end of said first resistor and supplied with a first input current having an amplitude $I_1$ greater than $I_{01}$, and a second input terminal connected to said first end of said second resistor and supplied with a second input current having an amplitude $I_2$, with the sum of said first and second input currents being greater than said critical current $I_{03}$, a portion of said first input current flowing in said second resistor in the absence of said second input current being less than or equal to said critical current $I_{02}$, the sum of said second input current and said portion of said first input current being greater than said critical current $I_{02}$, said circuit having an AND function and producing an output current derived from the connection between said third resistor and said specific Josephson junction when said first and second input currents are supplied at the same time.

4. A circuit as claimed in claim 1, further comprising a gate terminal connected to said first end of said second resistor and supplied with a gate current $I_g$ having an amplitude greater than $I_{02}$, and an input terminal connected to said first end of said first resistor and supplied with an input current having an amplitude $I_a$, with the sum of said input current and said gate current being greater than said critical current $I_{03}$, a portion of said gate current flowing in said first resistor in the absence of said input current being less than or equal to said critical current $I_{01}$, and the sum of said portion of said gate current and said input current being greater than said critical current $I_{01}$, said circuit having an amplifying function whereby an output, which is an amplified version of said input current, appears at the connection between said third resistor and said specific Josephson junction.

5. A circuit as claimed in claim 3, in which said circuit satisfies the conditions:

$$I_{01} = I_{02} = I_{03}/2 = I_0$$

$$R_1 = R_2 = R_3/2$$

$$I_1/3 \leqq I_{01}$$

$$I_1 > I_{01}$$

$$I_1/3 + I_2 > I_{02}$$

$$I_1 + I_2 > 2I_0.$$

6. A circuit as claimed in claim 1, further comprising $(N-3)$ additional resistors $(N \geqq 4)$, where N is an integer each having a predetermined resistance $R_N$, a first end and a second end, all of said resistors being connected at said second ends thereof to said second ends of said first, second and third resistors, and $(N-3)$ additional Josephson junctions each having a predetermined critical current $I_{ON}$ and connected between a reference potential and said first end of each of said $(N-3)$ additional resistors, respectively.

7. A circuit as claimed in claim 6, further comprising a first input terminal connected to said first end of said first resistor supplied with a first input current having an amplitude $I_1$ greater than said critical current $I_{01}$, a second input terminal connected to said first end of said second resistor being supplied with a second input current $I_2$, a portion of said first input current flowing in said second resistor in the absence of said second input current being less than or equal to said critical current $I_{02}$, the sum of said portion of said first input current and said second input current being greater than said critical current $I_{02}$, and an $(N-1)$th input terminal connected to said first end of at least one of said $(N-3)$ resistors and supplied with an additional input current having an amplitude $I_N$, the sum of said current $I_N$ and components of other input currents flowing in said at least one resistor being greater than said critical current $I_{ON}$, and the sum of all the input currents being greater than said critical current $I_{03}$.

8. A circuit as claimed in claim 6 or 7, wherein $N=4$.

9. A circuit as claimed in claim 6, further comprising $(N-1)$ input terminals connected to said first ends of respective ones of said resistors except the third resistor, each of said $(N-1)$ input terminals being supplied with a respective $(N-1)$th input current having a predetermined amplitude, the resistances of said resistors, the critical currents of said Josephson junctions and input current amplitudes being chosen such that an output appears at the connection between said third resistor and said specific Josephson junction when said input currents are supplied to M of said input terminals at the same time, where M is an integer and $M < N-1$.

10. A circuit as claimed in claim 9, wherein $N=4$ and $M=2$.

11. A circuit as claimed in claim 10, in which all said resistances are the same as each other and all said critical currents have an identical value $I_0$, said circuit satisfying the conditions:

$$I_1/3 \leqq I_0$$

$I > I_0$ $I_1/3 + I_2 > I_0$ $I_1 + I_2 > 2I_0$.

12. A circuit utilizing a plurality of Josephson junctions, each of which switches from a zero voltage state to a voltage state in response to a current greater than its respective critical current, said circuit comprising:
- a first resistor and a second resistor having predetermined resistances $R_1$ and $R_2$, respectively, each of said resistors having first and second ends, said resistors being connected at said second ends;
- a first Josephson junction and a second Josephson junction connected between said first ends of the first and second resistors, respectively and a reference potential, and having predetermined critical currents $I_{01}$ and $I_{02}$, respectively;
- a specific Josephson junction having a predetermined critical current $I_0$ and connected between said interconnected second ends of said first and second resistors and said reference potential;
- and a third resistor connected between said first ends of said first and second resistors and having a predetermined resistance $R_5$.

13. A circuit as claimed in claim 12, further comprising a fourth resistor having a predetermined resistance and connected in parallel to said specific Josephson junction.

14. A circuit as claimed in claim 12, further comprising a first input terminal connected to said first end of said first resistor and supplied with a first input current having an amplitude $I_1$ greater than said critical current $I_{01}$ of said first Josephson junction, and a second input terminal connected to said first end of said second resistor and supplied with a second input current having an amplitude $I_2$, a portion of said first input current flowing in said third resistor in the absence of said second input current being less than or equal to said critical current $I_{02}$, the sum of said portion of said first input current and said second input current being greater than said critical current $I_{02}$ of said second Josephson junction, said amplitude $I_2$ of said second input current also being sufficient for the sum of said first and second input currents to be greater than $I_0$ to switch said specific Josephson junction to the voltage state.

15. A circuit as claimed in claim 12, further comprising a gate terminal connected to said first end of said second resistor and supplied with a gate current having an amplitude greater than $I_{02}$ to switch said second Josephson junction to the voltage state, and an input terminal connected to said first end of said first resistor and supplied with an input current having an amplitude, a portion of said gate current flowing in said third resistor, in the absence of said input current being less than or equal to said critical current $I_{01}$, the sum of said portion on said gate current and said input current being greater than said critical current $I_{01}$, said amplitude of said input current also being sufficient for the sum of said gate and input currents to be greater than $I_0$ to switch said specific Josephson junction to the voltage state, said circuit having the amplifying function whereby an output, which is an amplified version of said input current, is picked up at the node among said Josephson junction, first resistor and second resistor.

16. A circuit as claimed in claim 14, in which said circuit statisfies the conditions:

$I_{01} = I_{02} = I_0/2$ $R_1 = R_2 = 2R_5$ $I_1/3 \leq I_{01}$ $I_1 > I_{01}$ $I_1/3 + I_2 > I_{01}$ $I_1 + I_2 > 2I_{01}$

* * * * *

UNITED STATES PATENT AND TRADEMARK OFFICE
CERTIFICATE OF CORRECTION

PATENT NO. : 4,538,077
DATED : August 27, 1985
INVENTOR(S) : Junichi SONE, Tokyo Japan It is certified that error appears in the above-identified patent and that said Letters Patent is hereby corrected as shown below:

Column 1, line 39, $L_{02}$, should read --$I_{02}$--;

line 66, After "providing" insert --the gate--.

Column 4, line 59, before "$I_0$" (last occurrence) " = " should read -- $\equiv$ --;.

Column 6, line 35, delete "circuits" and insert --junctions--;

line 46, "relationship" should read --relationships--.

Column 11, Claim 11, 2nd formula should read --$I_1 > I_0$--; instead of "$_1 > I_0$".

Signed and Sealed this

Eleventh Day of March 1986

[SEAL]

Attest:

DONALD J. QUIGG

Attesting Officer    Commissioner of Patents and Trademarks